(12) United States Patent
Kijima et al.

(10) Patent No.: US 10,897,005 B2
(45) Date of Patent: Jan. 19, 2021

(54) VIBRATING DEVICE

(71) Applicant: TDK CORPORATION, Tokyo (JP)

(72) Inventors: Kaoru Kijima, Tokyo (JP); Tatsuya Taki, Tokyo (JP); Shunsuke Ueno, Tokyo (JP); Atsushi Ezawa, Tokyo (JP); Haruna Sumi, Tokyo (JP); Tomohiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 388 days.

(21) Appl. No.: 15/890,669

(22) Filed: Feb. 7, 2018

(65) Prior Publication Data

US 2018/0226563 A1 Aug. 9, 2018

(30) Foreign Application Priority Data

Feb. 9, 2017 (JP) ................................ 2017-022545
Feb. 9, 2017 (JP) ................................ 2017-022546
Feb. 9, 2017 (JP) ................................ 2017-022547
Feb. 9, 2017 (JP) ................................ 2017-022548

(51) Int. Cl.
*H01L 41/053* (2006.01)
*H01L 41/09* (2006.01)

(52) U.S. Cl.
CPC ............ *H01L 41/09* (2013.01); *H01L 41/053* (2013.01)

(58) Field of Classification Search
CPC .............................. H01L 41/09; H01L 41/053
USPC ........................................ 310/311–371, 800
See application file for complete search history.

(56) References Cited

U.S. PATENT DOCUMENTS

| 3,979,565 | A | * | 9/1976 | McShane | ................. | G01F 1/66 |
| | | | | | | 310/327 |
| 4,364,017 | A | * | 12/1982 | Tokunaga | ............... | H03H 3/08 |
| | | | | | | 310/313 R |
| 9,324,931 | B2 | * | 4/2016 | Furukawa | ........... | H01L 41/0477 |
| 9,646,637 | B1 | * | 5/2017 | Xiong | .................... | G11B 5/483 |
| 2008/0239020 | A1 | | 10/2008 | Sugahara | | |
| 2016/0093792 | A1 | * | 3/2016 | Xiong | ................ | H01L 41/1132 |
| | | | | | | 360/294.4 |
| 2018/0233653 | A1 | * | 8/2018 | Kijima | ............... | H01L 41/0471 |

FOREIGN PATENT DOCUMENTS

| JP | H04-70100 A | 3/1992 |
| JP | H09-182189 A | 7/1997 |
| JP | 2003-134852 A | 5/2003 |
| JP | 2008-246888 A | 10/2008 |
| JP | 2013-219250 A | 10/2013 |

* cited by examiner

*Primary Examiner* — Thomas M Dougherty
(74) *Attorney, Agent, or Firm* — Oliff PLC

(57) ABSTRACT

A vibrating device includes a piezoelectric element, a resin member having electric insulation, a vibrating member made of metal, a first adhesive layer, and a second adhesive layer. The resin member includes a first principal surface and a second principal surface opposing each other. The vibrating member includes a third principal surface and a fourth principal surface opposing each other. The first adhesive layer joins the piezoelectric element and the first principal surface. The second adhesive layer joins the second principal surface and the third principal surface. An area of the resin member is greater than an area of the piezoelectric element, and an area of the vibrating member is greater than the area of the piezoelectric element. An area where the second adhesive layer adheres to the vibrating member is greater than an area where the first adhesive layer adheres to the resin member.

8 Claims, 7 Drawing Sheets

VIBRATING DEVICE

BACKGROUND OF THE INVENTION

1. Field of the Invention

The present invention relates to a vibrating device.

2. Description of Related Art

Known vibrating devices include a piezoelectric element and a vibrating member including a pair of principal surfaces opposing each other. (see Japanese Unexamined Patent Publication No. 2013-219250 and Japanese Unexamined Patent Publication No. H04-70100, for example). The piezoelectric element and the principal surface of the vibrating member are joined to each other. In the vibrating device disclosed in Japanese Unexamined Patent Publication No. 2013-219250, the vibrating member is made of metal.

SUMMARY OF THE INVENTION

As a result of investigation and research, the inventors of the present invention have discovered the following facts.

A displacement of the vibrating member decreases as a distance from the piezoelectric element increases. Therefore, in a case where the end portion of the piezoelectric element and the end portion of the vibrating member are away from each other, the vibrating device tends not to obtain a sufficient displacement at the end portion of the vibrating member. To secure the displacement of the vibrating member, the vibrating member is made of metal, for example. In a case where the end portion of the piezoelectric element and the end portion of the vibrating member are brought close to each other in order to improve the displacement at the end portion of the vibrating member, a short circuit may occur between the vibrating member and the piezoelectric element.

An object of a first aspect of the present invention is to provide a vibrating device in which occurrence of the short circuit is suppressed between the piezoelectric element and the vibrating member, and the displacement at the end portion of the vibrating member is improved.

A vibrating device according to a first aspect of the present invention includes a piezoelectric element, a resin member having electric insulation, a vibrating member made of metal, a first adhesive layer, and a second adhesive layer. The resin member includes a first principal surface and a second principal surface opposing each other. The vibrating member includes a third principal surface and a fourth principal surface opposing each other. The first adhesive layer joins the piezoelectric element and the first principal surface of the resin member. The second adhesive layer joins the second principal surface of the resin member and the third principal surface of the vibrating member. An area of the resin member is greater than an area of the piezoelectric element, and an area of the vibrating member is greater than the area of the piezoelectric element. An area where the second adhesive layer adheres to the vibrating member is greater than an area where the first adhesive layer adheres to the resin member.

In the first aspect, the area of the resin member is greater than the area of the piezoelectric element. Therefore, the resin member suppresses the occurrence of the short circuit between the piezoelectric element and the vibrating member. The area where the second adhesive layer adheres to the vibrating member is greater than the area where the first adhesive layer adheres to the resin member. Therefore, in the first aspect, the displacement at the end portion of the vibrating member is improved as compared with a vibrating device in which the adhesive area between the resin member and the piezoelectric element and the adhesive area between the resin member and the vibrating member are equal to each other. Even in a case where the piezoelectric element is smaller than the vibrating member, the displacement at the end portion of the vibrating member is secured. As a result, in the first aspect, the occurrence of the short circuit is suppressed between the piezoelectric element and the vibrating member, and the displacement at the end portion of the vibrating member is improved.

Next, as a result of investigation and research, the inventors of the present invention have discovered the following facts.

In a case where a vibration frequency of the vibrating device is in a range of 100 Hz to 500 Hz, vibration of the vibrating device tends to be recognized by human's tactile sense. The closer the vibration frequency of the piezoelectric element and the resonance frequency of the entire vibrating device are, the greater the displacement of the vibrating device is. In a case where the vibrating device is arranged in such a manner that the resonance frequency of the entire vibrating device is included within or near the above-described range, in the vibrating device, the sufficient displacement is secured at the vibration frequency that tends to be recognized by the human's tactile sense. Therefore, to secure ease of recognition by the human's tactile sense, the thickness of the member joined to the piezoelectric element is desired to be small so that the resonance frequency of the entire vibrating device is included within or near the above-described range.

Generally, the coefficient of the thermal expansion of the vibrating member made of metal is greater than the thermal expansion coefficient of the piezoelectric element. Therefore, the vibrating member may be deformed due to a temperature change. The less the thickness of the vibrating member is, the lower the rigidity of the vibrating member is, so that the less the thickness of the vibrating member is, the more the vibrating member tends to be deformed. In a case where the thickness of the vibrating member is small, external force may be applied to the piezoelectric element by deformation of the vibrating member due to the temperature change. In this case, cracks tend to occur in the piezoelectric element. For example, in a case where the vibrating device is driven in a configuration in which the vibrating member is joined to another member, if the vibrating member tends to be deformed, the vibrating member and the other member tend to be peeled off from each other.

An object of a second aspect of the present invention is to provide a vibrating device that tends not to be damaged and whose vibration tends to be recognized by the human's tactile sense.

A vibrating device according to a second aspect of the present invention includes a piezoelectric element, a resin member having electric insulation, and a vibrating member made of metal. The resin member includes a first principal surface joined to the piezoelectric element and a second principal surface opposing the first principal surface. The vibrating member includes a third principal surface joined to the second principal surface of the resin member and a fourth principal surface opposing the third principal surface. A thickness of the resin member is less than a thickness of the piezoelectric element, and the thickness of the resin member is less than a thickness of the vibrating member. The thickness of the vibrating member is equal to or greater than the thickness of the piezoelectric element.

In the second aspect, the thickness of the vibrating member is secured. Therefore, the vibrating device tends not to be damaged. The thickness of the resin member is less than each thickness of the piezoelectric element and the vibrating member. Therefore, the vibration of the vibrating device tends to be recognized by the human's tactile sense.

Next, as a result of investigation and research, the inventors of the present invention have discovered the following facts.

In a case where the vibrating member is made of metal, the following problem may occur. In a case where the vibrating device is close to an external member, a short circuit tends to occur between the vibrating member and the external member.

An object of a third aspect of the present invention is to provide a vibrating device in which occurrence of the short circuit is suppressed between the vibrating member and the external member even in a case where the vibrating member is made of metal.

A vibrating device according to a third aspect of the present invention includes a piezoelectric element, a resin member having electric insulation, and a vibrating member made of metal. The resin member includes a first principal surface joined to the piezoelectric element and a second principal surface opposing the first principal surface. The vibrating member includes a third principal surface joined to the second principal surface of the resin member and a fourth principal surface opposing the third principal surface. The resin member covers a whole of the third principal surface of the vibrating member.

In the third aspect, the resin member covers the whole of the third principal surface of the vibrating member. Therefore, the third principal surface of the vibrating member tends not to be connected electrically to the external member. As a result, the short circuit tends not to occur between the vibrating member and the external member.

The vibrating device according to each aspect may include a pair of electrodes electrically connected to the piezoelectric element. The pair of electrodes may be disposed on the first principal surface of the resin member. In this case, the electrodes arranged to apply a voltage to the piezoelectric element are disposed simply and in a space-saving manner.

Next, as a result of investigation and research, the inventors of the present invention have discovered the following facts.

In a case where the vibrating member is a glass plate, a Q value and strength of the vibrating member are relatively low. Therefore, the amount of displacement of the vibrating device tends not to improve.

An object of a fourth aspect of the present invention is to provide a vibrating device in which the amount of displacement is improved.

A vibrating device according to a fourth aspect of the present invention includes a piezoelectric element including a piezoelectric body and a first electrode and a second electrode, a resin member having electric insulation, a vibrating member made of metal, a third electrode, a fourth electrode, a first conductive resin layer, and a second conductive resin layer. The piezoelectric body includes a first principal surface and a second principal surface opposing each other. The first electrode and the second electrode are disposed on the first principal surface. The resin member includes a third principal surface joined to the piezoelectric element and a fourth principal surface opposing the third principal surface. The vibrating member includes a fifth principal surface joined to the fourth principal surface of the resin member and a sixth principal surface opposing the fifth principal surface. The third electrode and the fourth electrode are disposed on the third principal surface of the resin member. The first conductive resin layer connects the first electrode and the third electrode to each other. The second conductive resin layer connects the second electrode and the fourth electrode to each other.

In the fourth aspect, the vibrating member is made of metal. The vibrating member made of metal has a higher Q value and strength than those of a vibrating member made of glass. Therefore, the amount of displacement of the vibrating device is improved. The resin member is disposed between the vibrating member and the piezoelectric element. Therefore, even in a case where the vibrating member is made of metal, the occurrence of the short circuit is suppressed between the vibrating member and the piezoelectric element. The first electrode and the third electrode of the piezoelectric element are connected to each other by the first conductive resin layer. The second electrode and the fourth electrode of the piezoelectric element are connected to each other by the second conductive resin layer. Therefore, in the fourth aspect, the amount of displacement of the vibrating device is improved as compared with a configuration in which the first electrode and the third electrode are in contact with each other and the second electrode and the fourth electrode are in contact with each other.

In the fourth aspect, the third electrode and the fourth electrode may be separated from the piezoelectric element when viewed from a direction orthogonal to the first principal surface. In a case where the third electrode and the fourth electrode are disposed between the piezoelectric element and the resin member, the piezoelectric element is brought into contact with the third electrode and the fourth electrode, whereby the piezoelectric element may be inclined to the fifth principal surface and the sixth principal surface of the vibrating member. When the piezoelectric element and the resin member are joined to each other, force may be applied to the piezoelectric element from the third electrode and the fourth electrode. In these cases, cracks may occur in the piezoelectric body. In a case where the third and fourth electrodes are separated from the piezoelectric element when viewed from the direction orthogonal to the first principal surface, occurrence of inclination of the piezoelectric element and occurrence of cracking of the piezoelectric body are suppressed.

The vibrating device according to the fourth aspect may include an adhesive layer joining the piezoelectric element and the third principal surface. In this case, the piezoelectric element may include a fifth electrode disposed on the second principal surface and electrically connected to the first electrode. The adhesive layer may cover the fifth electrode. In this configuration, occurrence of a short circuit is suppressed between the fifth electrode, and the fourth electrode and second conductive resin layer.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
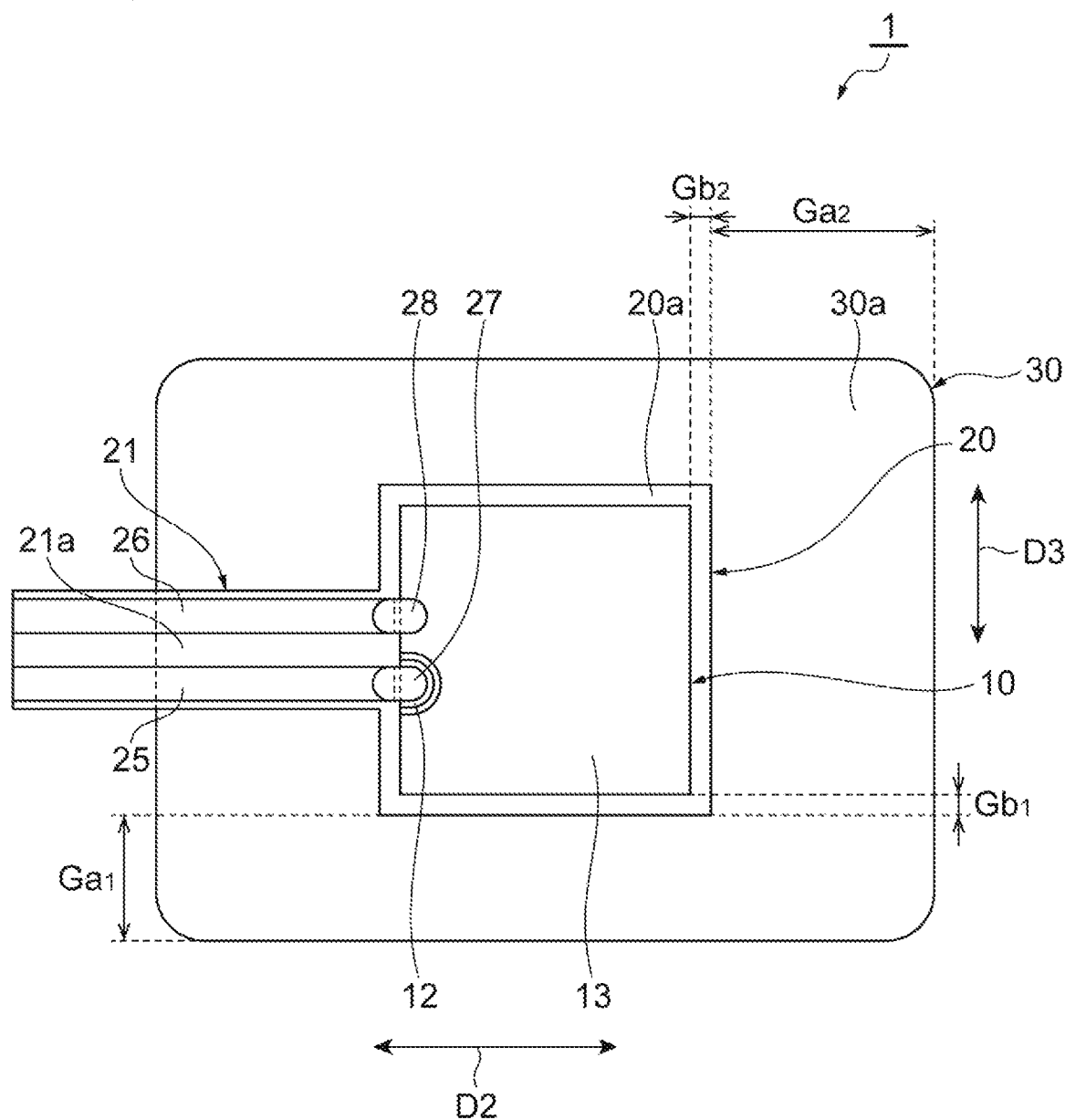
FIG. 1 is a plan view of a vibrating device according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
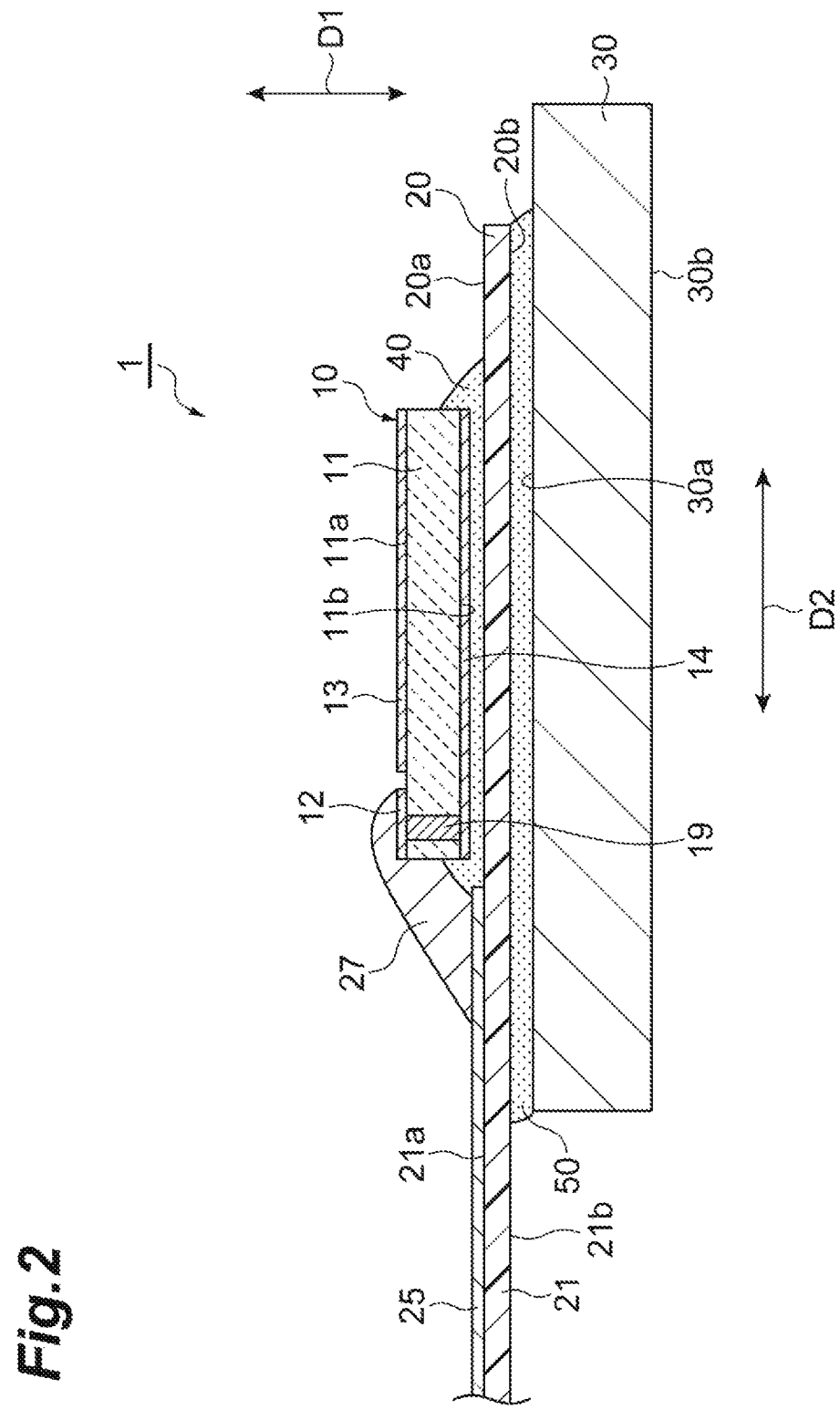
FIG. 2 is a diagram illustrating a cross-sectional configuration of the vibrating device.
Figure 3:
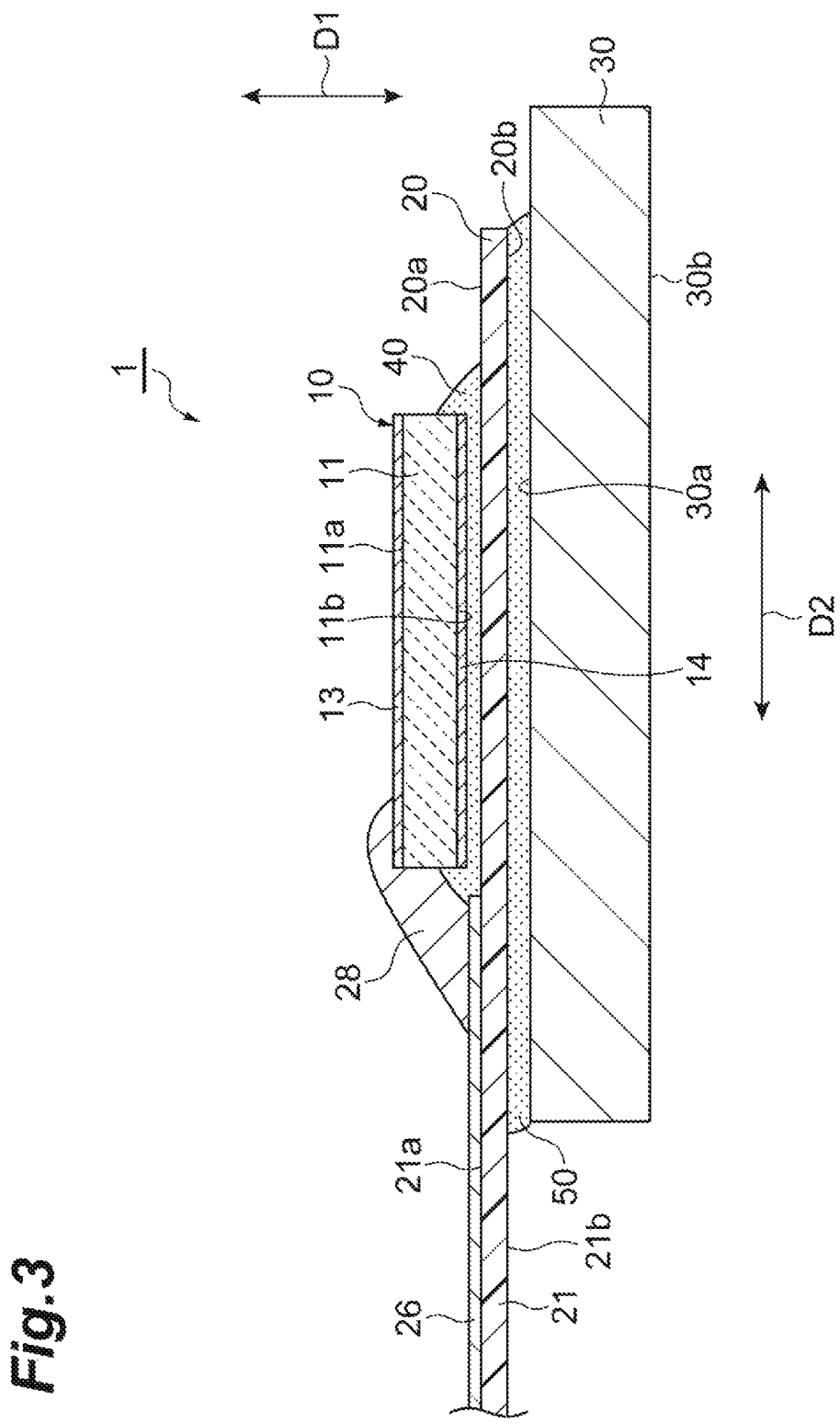
FIG. 3 is a diagram illustrating a cross-sectional configuration of the vibrating device.

A configuration will be described of a vibrating device 1 according to a first embodiment with reference to FIGS. 1 to 3. FIG. 1 is a plan view of the vibrating device according to the first embodiment. FIGS. 2 and 3 are diagrams each illustrating a cross-sectional configuration of the vibrating device.

As illustrated in FIG. 1, the vibrating device 1 includes a piezoelectric element 10, a resin member 20, a vibrating member 30, an adhesive layer 40, and an adhesive layer 50. The piezoelectric element 10 includes a piezoelectric body 11, a pair of electrodes 12 and 13, an electrode 14, and a via conductor 19. The adhesive layer 40 joins the piezoelectric element 10 and the resin member 20. The adhesive layer 50 joins the resin member 20 and the vibrating member 30.

The piezoelectric body 11 has a rectangular parallelepiped shape. The rectangular parallelepiped shape includes a shape of a rectangular parallelepiped in which corner portions and ridge portions are chamfered, and a shape of a rectangular parallelepiped in which corner portions and ridge portions are rounded. In the present embodiment, the piezoelectric body 11 has a plate shape. The piezoelectric body 11 includes a principal surface 11a and a principal surface 11b opposing each other. The piezoelectric body 11 has a rectangular shape when viewed from a first direction D1 orthogonal to the principal surfaces 11a and 11b. The length of one side of each of the principal surfaces 11a and 11b is 30 mm, for example. In this case, the piezoelectric body 11 has a square shape when viewed from the first direction D1. The size of each of the principal surfaces 11a and 11b is 30 mm×30 mm, for example. In this case, when viewed from the first direction D1, the area of the piezoelectric body 11 is 900 mm$^2$. That is, the area of the piezoelectric body 11 is the area of each of the principal surfaces 11a and 11b. The piezoelectric body 11 may have a circular shape when viewed from the first direction D1. The circular shape includes not only a perfect circular shape but also a shape other than the perfect circular shape. The circular shape includes an elliptical shape or an oval shape, for example. The thickness of the piezoelectric element 10 is 100 µm, for example. The thickness of the piezoelectric body 11 is 70 µm, for example. The thickness of each of the electrodes 12, 13, and 14 is 15 µm, for example. The "thickness" is the length in the first direction D1. The first direction D1 is a direction in which the principal surface 11a and the principal surface 11b oppose each other.

The piezoelectric body 11 is made of piezoelectric ceramic material. The piezoelectric ceramic material includes PZT[Pb(Zr, Ti)O$_3$], PT(PbTiO$_3$), PLZT[(Pb,La)(Zr, Ti)O$_3$], or barium titanate (BaTiO$_3$), for example. The piezoelectric body 11 is configured from a sintered body of a ceramic green sheet containing the above-described piezoelectric ceramic material, for example.

As illustrated in FIGS. 2 and 3, the pair of electrodes 12 and 13 is disposed on the principal surface 11a of the piezoelectric body 11. The electrode 14 is disposed on the principal surface 11b of the piezoelectric body 11. Each of the electrodes 12, 13, and 14 is a conductor and made of conductive material. The conductive material includes Ag, Pd, or Cu, for example. Each of the electrodes 12, 13, and 14 is configured as a sintered body of a conductive paste containing the conductive material.

The electrode 12 and the electrode 13 are separated from each other on the principal surface 11a. The area where the electrode 13 is in contact with the principal surface 11a is greater than the area where the electrode 12 is in contact with the principal surface 11a. The area where the electrode 14 is in contact with the principal surface 11b is greater than the area where the electrode 12 is in contact with the principal surface 11a. The area where the electrode 14 is in contact with the principal surface 11b is greater than the area where the electrode 13 is in contact with the principal surface 11a. The electrode 13 and the electrode 14 include respective regions overlapping each other in the first direction D1. The electrode 13 and the electrode 14 oppose each other in the first direction D1 in a state where the piezoelectric body 11 is interposed between the electrode 13 and the electrode 14. The electrode 12 and the electrode 14 oppose each other in the first direction D1 in a state where the piezoelectric body 11 is interposed between the electrode 12 and the electrode 14.

The via conductor 19 physically and electrically connects the electrode 12 and the electrode 14 to each other. The via conductor 19 is disposed near one side surface of the piezoelectric body 11 when viewed from the first direction D1. The via conductor 19 penetrates the piezoelectric body 11. The via conductor 19 includes a first end connected to the electrode 12 and a second end connected to the electrode 14. The via conductor 19 is a conductor and made of conductive material, similarly to the electrodes 12, 13, and 14. The conductive material includes Ag, Pd, or Cu, for example. The via conductor 19 is configured as the sintered body of the conductive paste containing the conductive material.

The resin member 20 includes a principal surface 20a and a principal surface 20b opposing each other. The principal surfaces 20a and 20b are parallel to the principal surfaces 11a and 11b. The resin member 20 has a rectangular shape when viewed from the first direction D1. The resin member 20 is a film-like or plate-like member. The rectangular shape includes a shape in which corners are rounded, for example. The resin member 20 may have a circular shape when viewed from the first direction D1. The circular shape includes not only a perfect circular shape but also a shape other than the perfect circular shape. The circular shape includes an elliptical shape or an oval shape, for example.

The resin member 20 is made of resin. The resin member 20 has electric insulation. The resin configuring the resin member 20 is a polyimide resin, a PET resin, or a polyparaxylylene resin, for example. The area of the resin member 20 is greater than the area of the piezoelectric body 11. The length of one side of each of the principal surfaces 20a and 20b is 40 mm, for example. In this case, the resin member 20 has a square shape when viewed from the first direction D1. The size of each of the principal surfaces 20a and 20b is 40 mm×40 mm, for example. In this case, when viewed from the first direction D1, the area of the resin member 20 is 1600 mm$^2$. That is, the area of the resin member 20 is the area of each of the principal surfaces 20a and 20b. The thickness of the resin member 20 is less than the thickness of the piezoelectric element 10. The thickness of the resin member 20 is 25 μm, for example. The "thickness" is the length in the first direction D1. The thermal expansion coefficient of the resin member 20 is greater than the thermal expansion coefficient of the piezoelectric element 10.

The vibrating device 1 includes an auxiliary portion 21. The auxiliary portion 21 is connected to the end portion of the resin member 20. In the present embodiment, the auxiliary portion 21 configures a part of the resin member 20. The auxiliary portion 21 includes a first region positioned on the vibrating member 30 and a second region positioned outside the vibrating member 30, when viewed from the first direction D1. In the present embodiment, the auxiliary portion 21 includes a first end connected to one side of the outer edge of the resin member 20 and a second end positioned outside the vibrating member 30 when viewed from the first direction D1. The auxiliary portion 21 intersects with one side of the outer edge of the vibrating member 30 when viewed from the first direction D1. In the present embodiment, the auxiliary portion 21 extends in a direction parallel to the principal surface 20a and orthogonal to the one side of the outer edge of the vibrating member 30. The auxiliary portion 21 is an extension portion. The first region of the auxiliary portion 21 overlaps with the vibrating member 30 when viewed from the first direction D1. The first region of the auxiliary portion 21 is joined to the vibrating member 30, similarly to the resin member 20.

The auxiliary portion 21 includes a principal surface 21a and a principal surface 21b opposing each other. The principal surfaces 21a and 21b are parallel to the principal surfaces 11a, 11b, 20a, and 20b. The auxiliary portion 21 has a rectangular shape when viewed from the first direction D1. The auxiliary portion 21 is a film-like or plate-like member. The rectangular shape includes a shape in which corners are rounded, for example. The width of the auxiliary portion 21 is less than the width of the resin member 20 (the length of one side of each of the principal surfaces 20a and 20b). The width of the auxiliary portion 21 is 12 mm, for example. The auxiliary portion 21 is made of resin. The auxiliary portion 21 has electric insulation. In the present embodiment, the auxiliary portion 21 is made of the same material as the resin member 20 and is formed integrally with the resin member 20. The auxiliary portion 21 may be made of a material different from the resin member 20. The auxiliary portion 21 may be formed separately from the resin member 20. The thickness of the first region of the auxiliary portion 21 is the same as the thickness of the resin member 20 and is less than the thickness of the piezoelectric element 10. In the present embodiment, the thickness of the second region of the auxiliary portion 21 is also the same as the thickness of the resin member 20 and less than the thickness of the piezoelectric element 10. The "thickness" is the length in the first direction D1. The thermal expansion coefficient of the auxiliary portion 21 is greater than the thermal expansion coefficient of the piezoelectric element 10. In the present embodiment, the principal surface 20a and the principal surface 21a configure the same surface, and the principal surface 20b and the principal surface 21b configure the same surface.

A pair of electrodes 25 and 26 is disposed on the principal surface 21a of the auxiliary portion 21. Part of the pair of electrodes 25 and 26 is also disposed on the principal surface 20a of the resin member 20. The pair of electrodes 25 and 26 is electrically connected to the piezoelectric element 10. Each of the electrodes 25 and 26 is separated from the piezoelectric element 10 when viewed from the first direction D1. Each of the electrodes 25 and 26 includes an end portion positioned near the first end of the auxiliary portion 21. Each of the electrodes 25 and 26 extends in the direction in which the auxiliary portion 21 extends. Each of the electrodes 25 and 26 is electrically connected to a power supply (not illustrated) of a device on which the vibrating device 1 is mounted, for example. Each of the electrodes 25 and 26 is a conductor and made of conductive material. The conductive material is Cu, for example.

The electrode 25 is electrically connected to the electrode 12 by a conductive resin layer 27. The electrode 26 is electrically connected to the electrode 13 by a conductive resin layer 28. The conductive resin layer is formed by curing a conductive resin paste, for example. The conductive resin paste contains a thermosetting resin, a conductive material, and an organic solvent, for example. The thermosetting resin is an epoxy resin, a urethane resin, a polyimide resin, a phenol resin, an acrylic resin, or a silicone resin, for example. The conductive material is a metal powder or a metal-plated particle, for example. The metal plating is Au plating, Cu plating, or Ag plating, for example.

The vibrating member 30 includes a principal surface 30a and a principal surface 30b opposing each other. The principal surfaces 30a and 30b are parallel to the principal surfaces 11a, 11b, 20a, and 20b. The vibrating member 30 has a plate shape. The vibrating member 30 has a rectangular shape when viewed from the first direction D1. The rectangular shape includes a shape in which corners are rounded, for example. In the present embodiment, the vibrating member 30 has a rectangular shape having a pair of long sides and a pair of short sides when viewed from the first direction D1. The vibrating member 30 may have a square shape when viewed from the first direction D1. The auxiliary portion 21 is disposed to intersect with one short side of the vibrating member 30 when viewed from the first direction D1. In the present embodiment, the auxiliary portion 21 is disposed to be orthogonal to the short side of the vibrating member 30 when viewed from the first direction D1. In this case, the auxiliary portion 21 extends in a direction D2 parallel to the long side of the vibrating member 30. The auxiliary portion 21 may be disposed to intersect with one long side of the vibrating member 30 when viewed from the first direction D1. For example, the auxiliary portion 21 may be disposed to be orthogonal to the long side of the vibrating member 30 when viewed from the first direction D1. In this case, the auxiliary portion 21 extends in a direction D3 parallel to the short side of the vibrating member 30. The vibrating member 30 may have a circular shape when viewed from the first direction D1. The circular shape includes not only a perfect circular shape but also a shape other than the perfect circular shape. The circular shape includes an elliptical shape or an oval shape, for example. In the present embodiment, when viewed from the first direction D1, the piezoelectric element 10 is disposed at a substantial center of the vibrating member 30 in such a manner that one side of the outer edge of the vibrating member 30 and one side of the outer edge of the piezoelectric element 10 are parallel to each other. When viewed from the first direction D1, the resin member 20 is disposed at a substantial center of the vibrating member 30 in such a manner that one side of the outer edge of the vibrating member 30 and one side of the outer edge of the resin member 20 are parallel to each other.

The area of the vibrating member 30 is greater than the area of the piezoelectric element 10 and greater than the area of the resin member 20. The length of each of the principal surfaces 30a and 30b in a long side direction is 80 mm, for example. The length of each of the principal surfaces 30a and 30b in a short side direction is 60 mm, for example. The size of each of the principal surfaces 30a and 30b is 80 mm×60 mm, for example. In this case, when viewed from the first direction D1, the area of the vibrating member 30 is substantially 4800 mm$^2$. That is, the area of the vibrating member 30 is the area of each of the principal surfaces 30a and 30b. The thickness of the resin member 20 is less than the thickness of the vibrating member 30. The thickness of the vibrating member 30 is equal to or greater than the thickness of the piezoelectric element 10. For example, the thickness of the vibrating member 30 is 250 μm. The "thickness" is the length in the first direction D1. The thermal expansion coefficient of the vibrating member 30 is greater than the thermal expansion coefficient of the piezoelectric element 10 and greater than the thermal expansion coefficient of the resin member 20. The vibrating member 30 is made of metal. The vibrating member 30 is made of Ni, stainless steel, brass, or Invar, for example.

As illustrated in FIG. 1, when viewed from the first direction D1, the resin member 20 is separated by a length $Ga_1$ from each long side of the vibrating member 30 (principal surface 30a), and separated by a length $Ga_2$ from each short side of the vibrating member 30 (principal surface 30a). In the present embodiment, the resin member 20 is positioned at a substantial center in the direction D2 on the vibrating member 30 (principal surface 30a) and positioned at a substantial center in the direction D3. As illustrated in FIG. 1, when viewed from the first direction D1, the resin member 20 is separated by a length $Gb_1$ from the side (side parallel to the long side of the vibrating member 30) of the piezoelectric element 10 (principal surface 10a) and separated by a length $Gb_2$ from the side (side parallel to the short side of the vibrating member 30) of the piezoelectric element 10 (principal surface 10a). In the present embodiment, the piezoelectric element 10 is positioned at a substantial center in the direction D2 on the resin member 20 (principal surface 20a) and positioned at a substantial center in the direction D3. The length $Ga_1$ is 2% or more of the length in the short side direction of the vibrating member 30, for example. The length $Ga_2$ is 2% or more of the length in the long side direction of the vibrating member 30, for example. The length $Gb_1$ is 2% or more of the length of the side of the piezoelectric element 10, parallel to the short side of the vibrating member 30, for example. The length $Gb_2$ is 2% or more of the length of the side of the piezoelectric element 10, parallel to the long side of the vibrating member 30, for example.

In a case where the length of the long side of the vibrating member 30 is 80 mm and the length of the short side of the vibrating member 30 is 60 mm, the length $Ga_1$ is 2 mm or more, for example, and the length $Ga_2$ is 2 mm or more, for example. In a case where the length of one side of the piezoelectric element 10 is 30 mm, the length $Gb_1$ is 0.5 mm or more, for example, and the length $Gb_2$ is 0.5 mm or more, for example. The length $Ga_1$ and the length $Ga_2$ may be different from each other, or equal to each other. The length $Gb_1$ and the length $Gb_2$ may be different from each other, or equal to each other. The length $Ga_1$ and the length $Gb_1$ may be different from each other, or equal to each other. The length $Ga_2$ and the length $Gb_2$ may be different from each other, or equal to each other.

Figure 4:
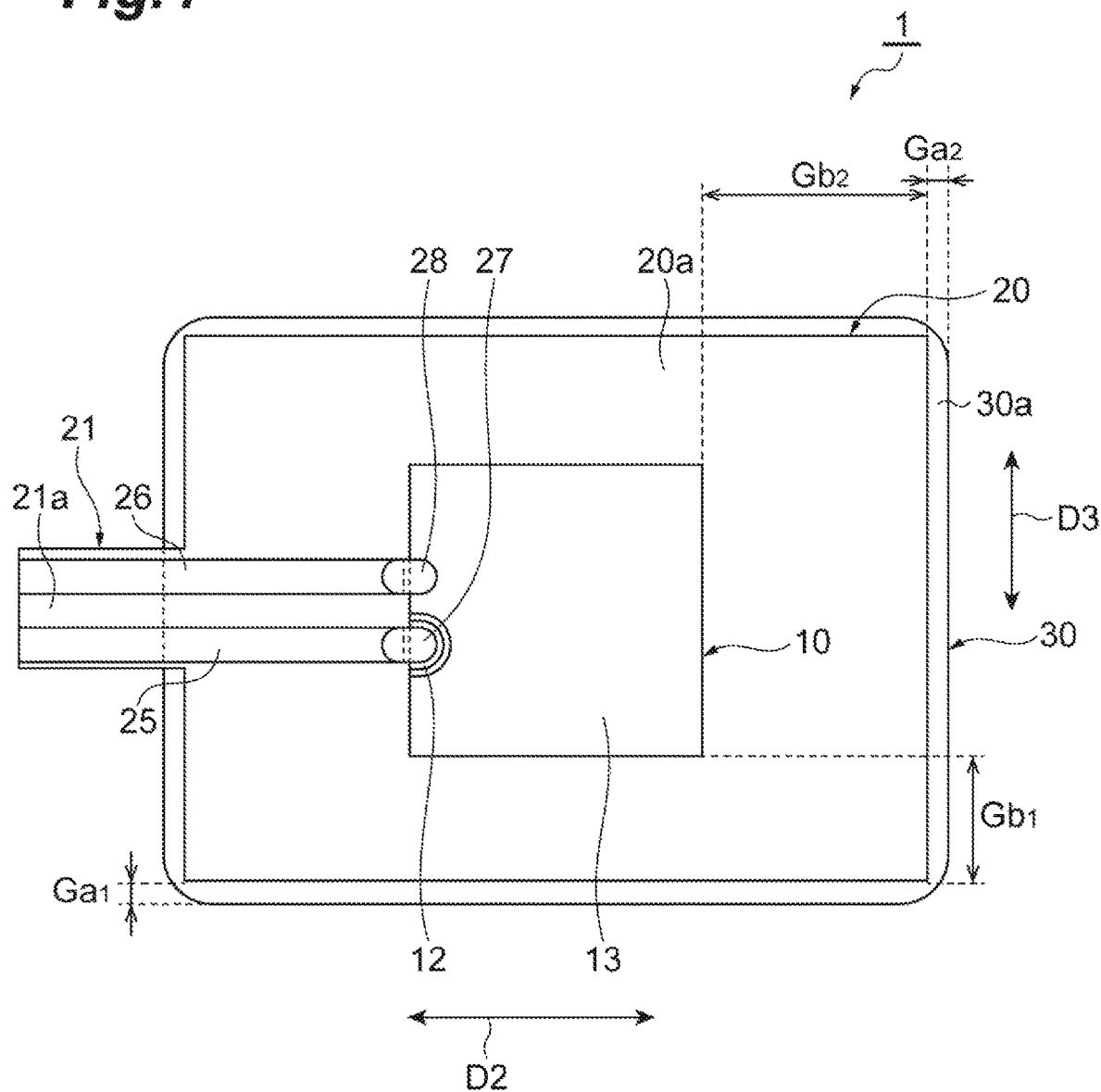
FIG. 4 is a plan view of a vibrating device according to a modification of the first embodiment.

For example, in the present embodiment, in a case where the length of one side of the resin member 20 (principal surface 20a) is 32 mm, the length $Ga_1$ is 14 mm, the length $Ga_2$ is 24 mm, and the lengths $Gb_1$ and $Gb_2$ are each 1 mm. As illustrated in FIG. 4, the resin member 20 (the principal surfaces 20a and 20b) may have a rectangular shape having a pair of long sides and a pair of short sides when viewed from the first direction D1. A direction parallel to the long side of the resin member 20 coincides with the direction D2, and a direction parallel to the short side of the resin member 20 coincides with the direction D3. In the vibrating device 1 illustrated in FIG. 4, the length of the long side of the resin member 20 is 76 mm, for example, and the length of the short side of the resin member 20 is 56 mm, for example. In this case, the lengths $Ga_1$ and $Ga_2$ are each 2 mm, and the length $Gb_1$ is 12 mm. The length $Gb_2$ is 22 mm.

The adhesive layer 40 has electric insulation. The adhesive layer 40 joins the piezoelectric element 10 and the principal surface 20a of the resin member 20. The adhesive layer 40 is in contact with the principal surface 10b of the piezoelectric element 10 and the principal surface 20a of the resin member 20. In the present embodiment, the adhesive layer 40 is in contact with the principal surface 11b of the piezoelectric element 10 and in contact with the side surface of the piezoelectric element 10. The adhesive layer 40 covers the electrode 14. In the present embodiment, the entire surface of the electrode 14 is covered with the adhesive layer 40, and the electrode 14 is not exposed from the adhesive layer 40. The thickness of the adhesive layer 40 is 7 μm or less, for example.

The adhesive layer 50 has electric insulation. The adhesive layer 50 joins the principal surface 20b of the resin member 20 and the principal surface 30a of the vibrating member 30. The adhesive layer 50 is in contact with the principal surface 20b of the resin member 20 and the principal surface 30a of the vibrating member 30. The adhesive layer 50 joins the first region of the auxiliary portion 21 and the vibrating member 30. The thickness of the adhesive layer 50 is 7 μm or less, for example.

The area where the adhesive layer 50 adheres to the vibrating member 30 is greater than the adhesive area where the adhesive layer 40 adheres to the resin member 20. In the present embodiment, the adhesive layer 40 adheres to a whole of the principal surface 11b of the piezoelectric element 10. The adhesive layer 50 adheres to a whole of the principal surface 20b of the resin member 20.

The adhesive layers 40 and 50 each are a resin or a double-sided adhesive tape, for example. The resin is a thermosetting resin or an anaerobic curing resin, for example. The thermosetting resin is an epoxy resin, a urethane resin, or a cyanoacrylate resin, for example. The anaerobic curing resin is an acrylic resin, for example. In a case where the adhesive layers 40 and 50 are each made of the anaerobic curing resin, a heating process is unnecessary during curing of the resin. Therefore, thermal deformation of the resin member 20 is prevented. In a case where the adhesive layers 40 and 50 are each made of the thermosetting resin, a material having a relatively low curing temperature is selected, whereby thermal deformation of the resin member 20 is suppressed. The adhesive layers 40 and 50 each do not contain a conductive filler.

Next, operation and effects will be described of the vibrating device 1.

In a case where voltages of different polarities are applied to the electrode 12 (electrode 25) and the electrode 13 (electrode 26), an electric field is generated between the electrode 14 and the electrode 13. Therefore, a region sandwiched between the electrode 13 and the electrode 14 in the piezoelectric body 11 is piezoelectrically activated, and a displacement occurs in the region. A region in the piezoelectric body 11 sandwiched between the electrode 13 and the electrode 14 is an active region. For example, in the piezoelectric element 10, in a case where an AC voltage is applied to the pair of electrodes 12 and 13, the piezoelectric element 10 repeats expansion and contraction in accordance with the frequency of the applied AC voltage.

The piezoelectric element 10 and the resin member 20 are joined by the adhesive layer 40. The resin member 20 and the vibrating member 30 are joined by the adhesive layer 50. Therefore, the vibrating member 30 vibrates to bend integrally with the piezoelectric element 10 in accordance with repetition of expansion and contraction in the piezoelectric element 10. The higher the Q value and the strength of the vibrating member 30 is, the more the amount of displacement of the vibrating member 30 is improved.

In the vibrating device 1, the vibrating member 30 is made of metal. In a case where the vibrating member 30 is made of metal, the vibrating member 30 has a higher Q value and strength as compared with a case where the vibrating member 30 is made of glass. Therefore, in the case where the vibrating member 30 is made of metal, the amount of displacement of the vibrating device 1 is improved.

The resin member 20 having electric insulation is disposed between the vibrating member 30 and the piezoelectric element 10. Therefore, even in the case where the vibrating member 30 is made of metal, the vibrating member 30 and the piezoelectric element 10 are reliably insulated electrically from each other. As a result, occurrence of a short circuit is suppressed between the vibrating member 30 and the piezoelectric element 10 (electrodes 12, 13, and 14). The pair of electrodes 25 and 26 is disposed on the auxiliary portion 21 and the resin member 20 having electric insulation. Therefore, the pair of electrodes 25 and 26, and the vibrating member 30 are reliably insulated electrically from each other. As a result, occurrence of a short circuit is suppressed between the pair of electrodes 25 and 26, and the vibrating member 30.

The electrode 12 of the piezoelectric element 10 and the electrode 25 are connected to each other by the conductive resin layer 27, and the electrode 13 of the piezoelectric element 10 and the electrode 26 are connected to each other by the conductive resin layer 28. Therefore, in the vibrating device 1, the amount of displacement is improved as compared with a configuration in which the electrode 12 and the electrode 25 are in contact with each other and the electrode 13 and the electrode 26 are in contact with each other.

The pair of electrodes 25 and 26 is separated from the piezoelectric element 10 when viewed from the first direction D1. In a case where the pair of electrodes 25 and 26 is disposed between the piezoelectric element 10 and the resin member 20, the piezoelectric element 10 is brought into contact with the pair of electrodes 25 and 26, whereby the piezoelectric element 10 may be inclined to the principal surfaces 30a and 30b of the vibrating member 30. When the piezoelectric element 10 and the resin member 20 are joined to each other, force may be applied to the piezoelectric element 10 from the electrodes 25 and 26. In these cases, cracks may occur in the piezoelectric body 11. In a case where the pair of electrodes 25 and 26 is separated from the piezoelectric element 10 when viewed from the first direction D1, occurrence of inclination of the piezoelectric element 10 and occurrence of cracking of the piezoelectric body 11 are suppressed.

The adhesive layer 40 has electric insulation and covers the electrode 14. Therefore, occurrence of a short circuit is suppressed between the electrode 14, and the electrode 26 and conductive resin layer 28.

In the vibrating device 1, the area of the resin member 20 is greater than the area of the piezoelectric element 10. Therefore, the resin member 20 suppresses the occurrence of the short circuit between the piezoelectric element 10 and the vibrating member 30. The area where the adhesive layer 50 adheres to the vibrating member 30 is greater than the area where the adhesive layer 40 adheres to the resin member 20. Therefore, in the vibrating device 1, the displacement is improved at the end portion of the vibrating member 30, as compared with a vibrating device in which the adhesive area between the resin member 20 and the piezoelectric element 10 is equal to the adhesive area between the resin member 20 and the vibrating member 30. Even in a case where the piezoelectric element 10 is smaller than the vibrating member 30, the displacement is secured at the end portion of the vibrating member 30. As a result, in the vibrating device 1, the occurrence of the short circuit is suppressed between the piezoelectric element 10 and the vibrating member 30, and the displacement at the end portion of the vibrating member 30 is improved.

The displacement of the vibrating member 30 is the greatest in a region where the piezoelectric element 10 is joined, and decreases as a distance from the piezoelectric element 10 increases. Therefore, the displacement near the short side of the vibrating member 30 is less than the displacement near the long side of the vibrating member 30. In the vibrating device 1, the auxiliary portion 21 is positioned on the short side of the vibrating member 30, so that the auxiliary portion 21 and the vibrating member 30 tend not to be peeled off from each other.

In the case where the vibrating member 30 is made of metal, the thermal expansion coefficient of the vibrating member 30 is greater than the thermal expansion coefficient of the piezoelectric element 10. Therefore, the vibrating member 30 may be deformed due to a temperature change. The less the thickness of the vibrating member 30 is, the lower the rigidity of the vibrating member 30 is, so that the less the thickness of the vibrating member 30 is, the more the vibrating member 30 tends to be deformed. In a case where the thickness of the vibrating member 30 is small, external force may be applied to the piezoelectric element 10 by deformation of the vibrating member 30 due to the temperature change. In this case, cracks tend to occur in the piezoelectric element 10. For example, in a case where the vibrating device 1 is driven in a configuration in which the vibrating member 30 is joined to another member, if the vibrating member 30 tends to be deformed, the vibrating member 30 and the other member tend to be peeled off from each other.

In the vibrating device 1, the thickness of the vibrating member 30 is equal to or greater than the thickness of the piezoelectric element 10. In this case, the thickness of the vibrating member 30 is secured, so that the vibrating device 1 tends not to be damaged. The thickness of the resin member 20 is less than the thickness of each of the piezoelectric element 10 and the vibrating member 30. In this case, the vibration of the vibrating device 1 tends to be recognized by the human's tactile sense.

The vibrating device 1 includes the pair of electrodes 25 and 26 electrically connected to the piezoelectric element 10. The pair of electrodes 25 and 26 is disposed on the principal surface 20a of the resin member 20 (the principal surface 21a of the auxiliary portion 21). In this case, the electrodes 25 and 26 for applying a voltage to the piezoelectric element 10 are disposed simply and in a space-saving manner.

Second Embodiment

Figure 5:
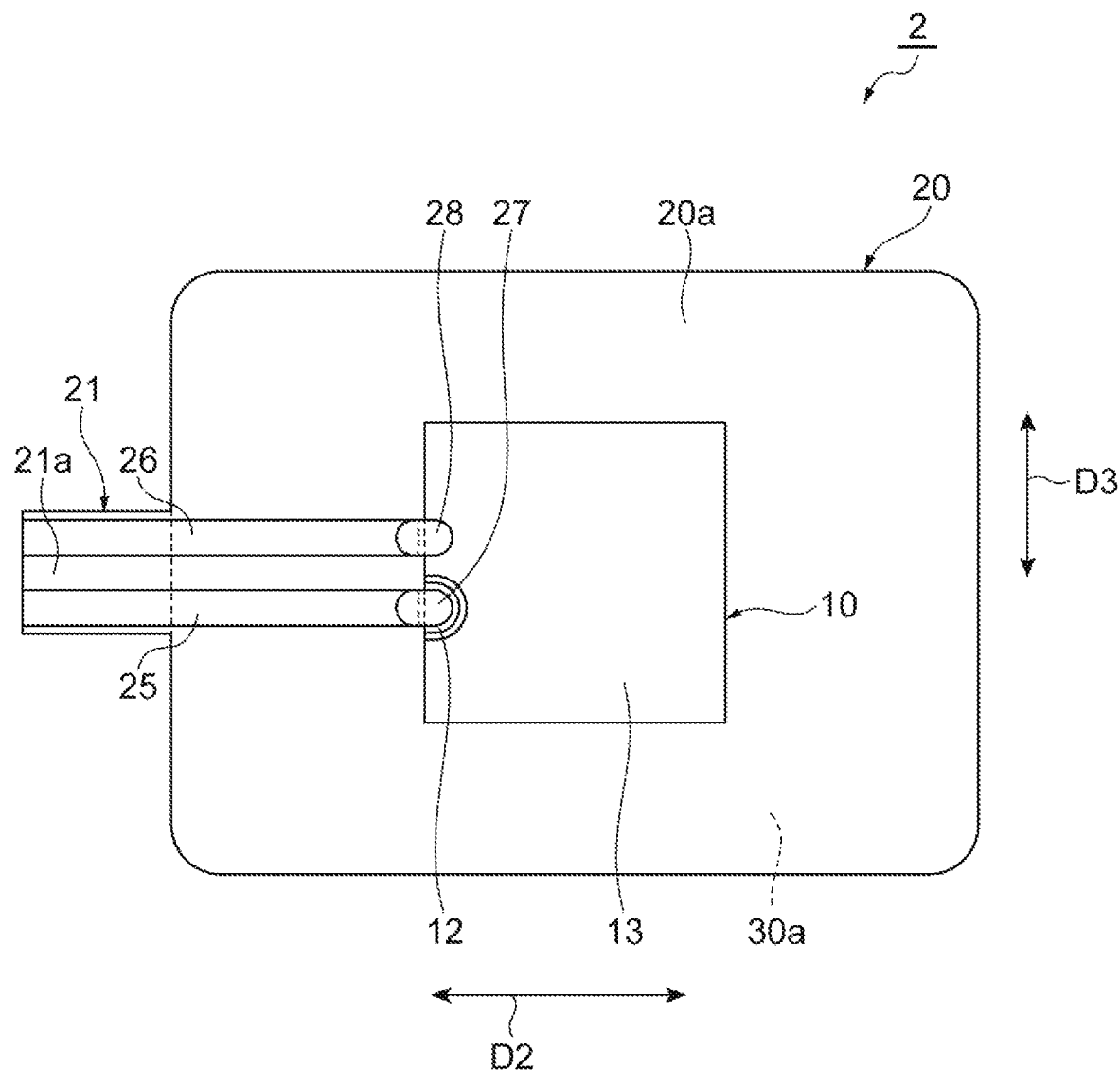
FIG. 5 is a plan view of a vibrating device according to a second embodiment.
Figure 6:
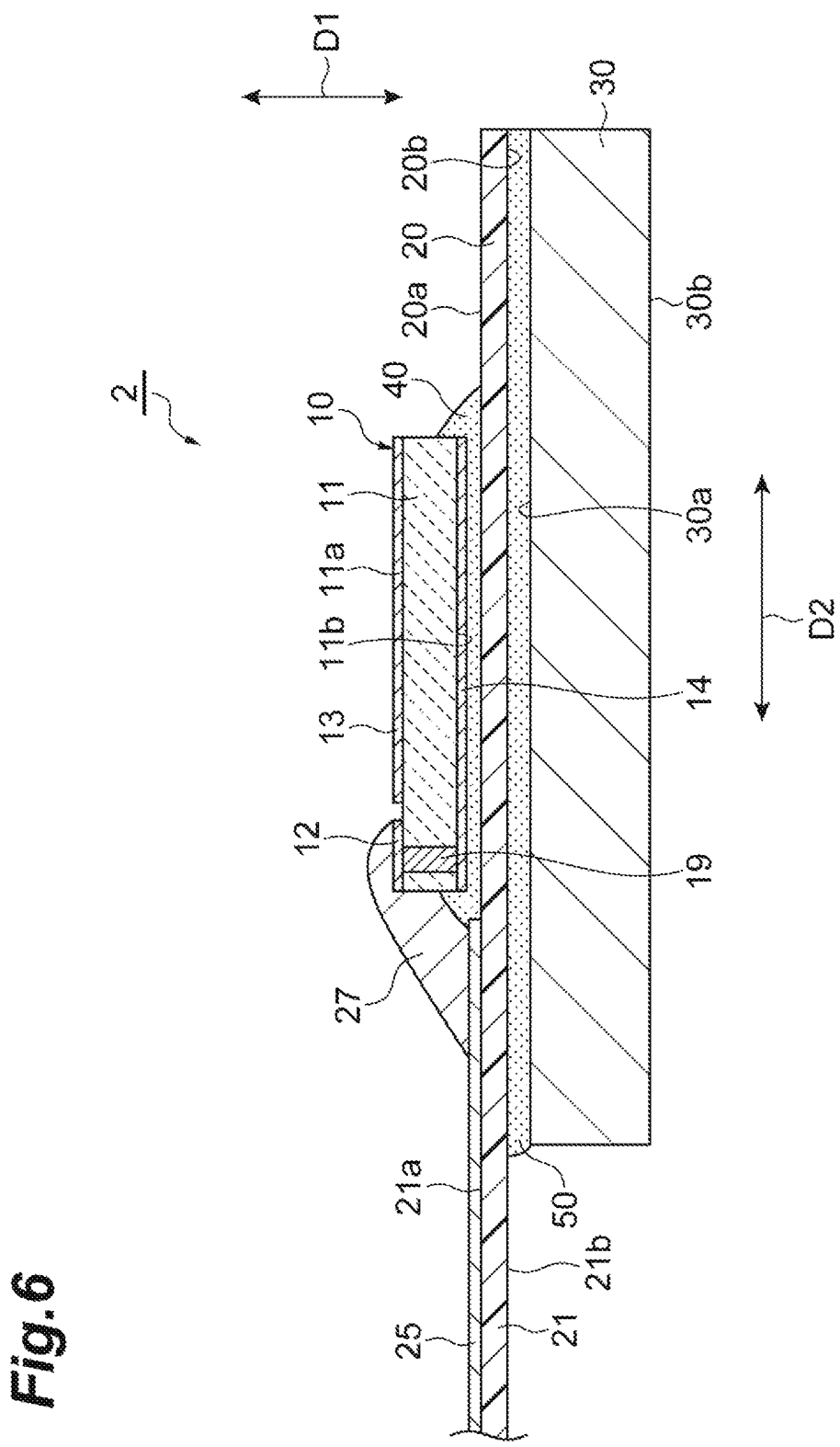
FIG. 6 is a diagram illustrating a cross-sectional configuration of the vibrating device.
Figure 7:
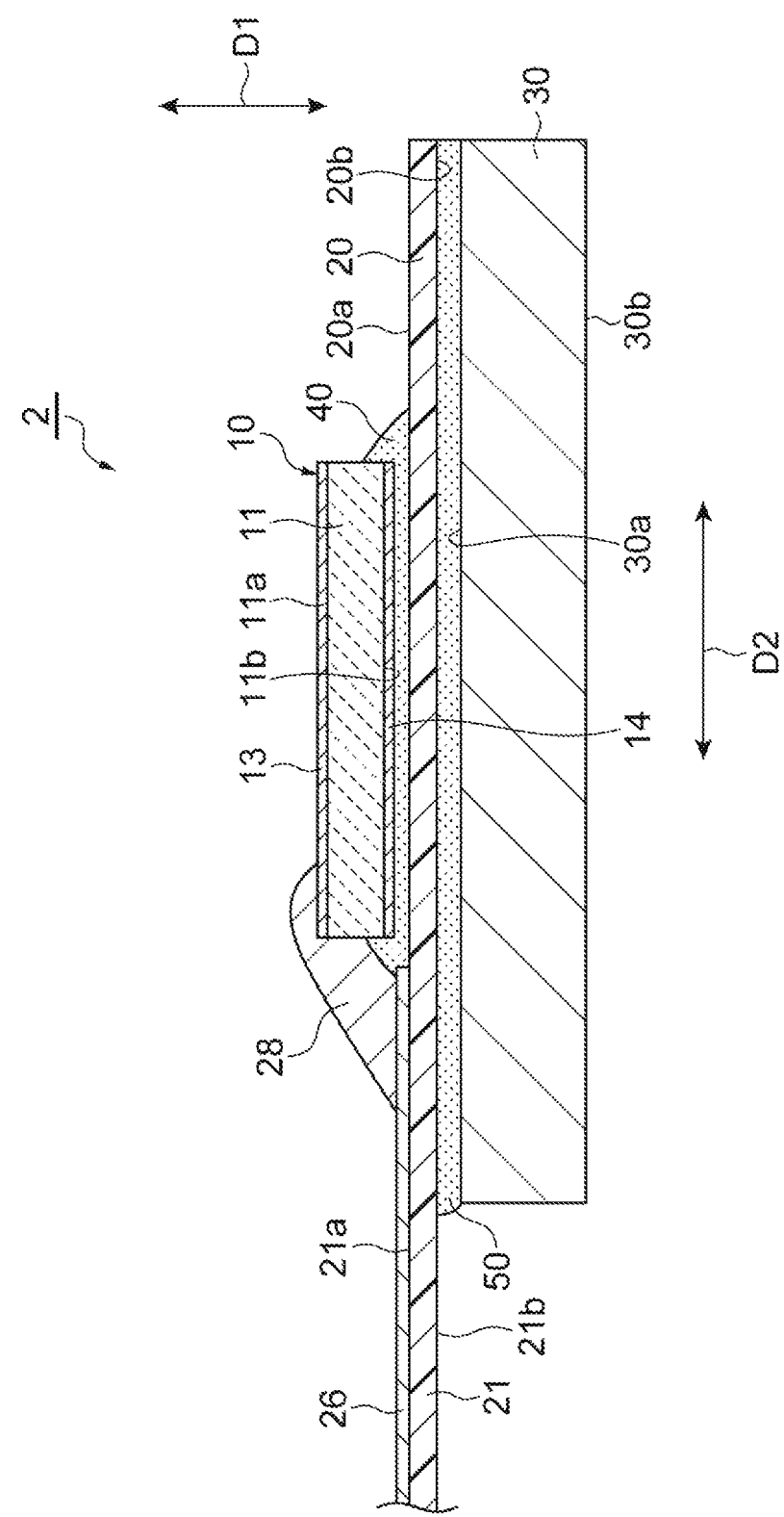
FIG. 7 is a diagram illustrating a cross-sectional configuration of the vibrating device.

A configuration will be described of a vibrating device 2 according to a second embodiment, with reference to FIGS. 5 to 7. FIG. 5 is a plan view of the vibrating device according to the second embodiment. FIGS. 6 and 7 are diagrams each illustrating a cross-sectional configuration of the vibrating device. The vibrating device 2 is different from the vibrating device 1 in the shape of a resin member 20 (auxiliary portion 21) when viewed from a first direction D1.

As illustrated in FIGS. 5 to 7, the vibrating device 2 includes a piezoelectric element 10, a resin member 20, a vibrating member 30, an adhesive layer 40, and an adhesive layer 50, similarly to the vibrating device 1. The piezoelectric element 10 includes a piezoelectric body 11, a pair of electrodes 12 and 13, an electrode 14, and a via conductor 19. The adhesive layer 40 joins the piezoelectric element 10 and the resin member 20. The adhesive layer 50 joins the resin member 20 and the vibrating member 30.

Hereinafter, differences will be mainly described between the vibrating device 2 and the vibrating device 1.

The resin member 20 has a rectangular shape when viewed from the first direction D1. The rectangular shape includes a shape in which corners are rounded, for example. In the present embodiment, the vibrating member 30 has a rectangular shape having a pair of long sides and a pair of short sides when viewed from the first direction D1. In the present embodiment, the resin member 20 has the same shape as the vibrating member 30 when viewed from the first direction D1. In a case where the vibrating member 30 has a square shape when viewed from the first direction D1, for example, the resin member 20 has the same square shape as the vibrating member 30 when viewed from the first direction D1. In a case where the vibrating member 30 has a circular shape when viewed from the first direction D1, for example, the resin member 20 has the same circular shape as the vibrating member 30 when viewed from the first direction D1. The circular shape includes not only a perfect circular shape but also a shape other than the perfect circular shape. The circular shape includes an elliptical shape or an oval shape, for example.

The area of the resin member 20 is greater than the area of the piezoelectric body 11. The length of each of principal surfaces 20a and 20b in the long side direction is 80 mm, for example. The length of each of the principal surfaces 20a and 20b in the short side direction is 60 mm, for example. The size of each of the principal surfaces 20a and 20b is 80 mm×60 mm, for example. In this case, when viewed from the first direction D1, the area of the resin member 20 is substantially 4800 mm². The area of the resin member 20 is equal to the area of the vibrating member 30.

In the vibrating device 2, the auxiliary portion 21 includes only a second region. The auxiliary portion 21 is not substantially joined to the vibrating member 30. The auxiliary portion 21 has a rectangular shape when viewed from the first direction D1. The auxiliary portion 21 is a film-like or plate-like member. The rectangular shape includes a shape in which corners are rounded, for example. The width of the auxiliary portion 21 is less than the width of the resin member 20 (the length of one side of each of the principal surfaces 20a and 20b). The width of the auxiliary portion 21 is 12 mm, for example. The thickness of the auxiliary portion 21 (the second region) is the same as the thickness of the resin member 20 and is less than the thickness of the piezoelectric element 10. The "thickness" is the length in the first direction D1. The thermal expansion coefficient of the auxiliary portion 21 is greater than the thermal expansion coefficient of the piezoelectric element 10.

The adhesive layer 50 directly covers a whole of a principal surface 30a of the vibrating member 30. The resin member 20 covers the whole of the principal surface 30a in a state where the adhesive layer 50 is interposed between the vibrating member 30 and the resin member 20. The resin member 20 indirectly covers the whole of the principal surface 30a. When viewed from the first direction D1, the principal surface 30a is not exposed from the resin member 20, and the principal surface 30a cannot be visually observed.

When viewed from the first direction D1, the shape of the vibrating member 30 is the same as the shape of the resin member 20 and the shape of the adhesive layer 50. Therefore, the area of the vibrating member 30 is equal to the area of the resin member 20 and the area of the adhesive layer 50, and is greater than the area of the piezoelectric element 10. In the vibrating device 2, the lengths $Ga_1$, $Ga_2$, $Gb_1$, and $Gb_2$ are "0".

In the vibrating device 2, the resin member 20 covers the whole of the principal surface 30a of the vibrating member 30. Therefore, the principal surface 30a of the vibrating member 30 tends not to be connected electrically to the external member. As a result, a short circuit tends not to occur between the vibrating member 30 and the external member. The vibrating device 2 has the above-described effects of the vibrating device 1.

Although the embodiments and modifications of the present invention have been described above, the present invention is not necessarily limited to the embodiments and modifications, and the embodiment can be variously changed without departing from the scope of the invention.

The electrode 12 and the electrode 25 may be connected to each other by a material other than a conductive resin layer 27. The electrode 12 and the electrode 25 may be connected to each other by solder, for example. The electrode 13 and the electrode 26 may be connected to each other by a material other than a conductive resin layer 28. The electrode 13 and the electrode 26 may be connected to each other by solder, for example. From a viewpoint of improving the amount of displacement of the vibrating device 1 described above, the electrode 12 and the electrode 25 may be connected to each other by the conductive resin layer 27, and the electrode 13 and the electrode 26 are connected to each other by the conductive resin layer 28.

The pair of electrodes 25 and 26 may be in contact with the piezoelectric element 10 when viewed from the first direction D1. From a viewpoint of suppressing the occurrence of the inclination of the piezoelectric element 10 and suppressing the occurrence of cracking of the piezoelectric body 11 described above, the pair of electrodes 25 and 26 may be separated from the piezoelectric element 10 when viewed from the first direction D1.

The area of the resin member 20 may be equal to or less than the area of the piezoelectric element 10. From a viewpoint of suppressing the occurrence of the short circuit between the piezoelectric element 10 and the vibrating member 30 described above, the area of the resin member 20 may be greater than the area of the piezoelectric element 10.

The area where the adhesive layer 50 adheres to the vibrating member 30 may be equal to or less than the area where the adhesive layer 40 adheres to the resin member 20. From a viewpoint of improving the displacement at the end portion of the vibrating member 30 described above, the area where the adhesive layer 50 adheres to the vibrating member 30 may be greater than the area where the adhesive layer 40 adheres to the resin member 20.

The auxiliary portion 21 may be positioned on the long side of the vibrating member 30. From a viewpoint of suppressing peeling between the auxiliary portion 21 and the vibrating member 30 described above, the auxiliary portion 21 may be positioned on the short side of the vibrating member 30.

The thickness of the vibrating member 30 may be less than the thickness of the piezoelectric element 10. From a viewpoint of suppressing damage of the vibrating device 1 described above, the thickness of the vibrating member 30 may be equal to or greater than the thickness of the piezoelectric element 10.

The thickness of the resin member 20 may be equal to or greater than the thickness of each of the piezoelectric element 10 and the vibrating member 30. From a viewpoint of vibration recognition of the vibrating device 1 described above, the thickness of the resin member 20 may be less than the thicknesses of each of the piezoelectric element 10 and the vibrating member 30.

The vibrating device 1 does not have to include the pair of electrodes 25 and 26. The electrodes 12 and 13 may be electrically connected to respective electrodes positioned outside the vibrating device 1 by wire bonding, for example.

The piezoelectric element 10 may include one or a plurality of internal electrodes in the piezoelectric body 11. In this case, the piezoelectric body 11 may include a plurality of piezoelectric layers, and the internal electrodes and the piezoelectric layers may be alternately disposed.

The electrodes 12 and 13 may be disposed on the principal surface 11b. The electrodes 14 may be disposed on the principal surface 11a.

The vibrating device 1 does not have to include the electrode 12. Only the electrode 13 may be disposed on the principal surface 11a. In this case, the electrode 25 may be electrically connected to the electrode 14 directly or through a conductive filler.

The vibrating member 30 may be a housing of an electronic device, for example. The vibrating member 30 may be a member different from the housing of the electronic device, for example. In this case, the vibrating member 30 may be attached to the housing by surface adhesion.

What is claimed is:

1. A vibrating device comprising:
a piezoelectric element;
a resin member having electric insulation and including a first principal surface and a second principal surface opposing each other;
a vibrating member including a third principal surface and a fourth principal surface opposing each other and made of metal;
a first adhesive layer joining the piezoelectric element and the first principal surface of the resin member; and
a second adhesive layer joining the second principal surface of the resin member and the third principal surface of the vibrating member, wherein
an area of the resin member is greater than an area of the piezoelectric element, and an area of the vibrating member is greater than the area of the piezoelectric element, and
an area where the second adhesive layer adheres to the vibrating member is greater than an area where the first adhesive layer adheres to the resin member.

2. The vibrating device according to claim 1, further comprising
a pair of electrodes disposed on the first principal surface of the resin member and electrically connected to the piezoelectric element.

3. A vibrating device comprising:
a piezoelectric element;
a resin member having electric insulation and including a first principal surface joined to the piezoelectric element and a second principal surface opposing the first principal surface;
a vibrating member including a third principal surface joined to the second principal surface of the resin member and a fourth principal surface opposing the third principal surface and made of metal; and
a pair of electrodes disposed on the first principal surface of the resin member and electrically connected to the piezoelectric element, wherein
the pair of electrodes is separated from the piezoelectric element,
a thickness of the resin member is less than a thickness of the piezoelectric element, and the thickness of the resin member is less than a thickness of the vibrating member, and
the thickness of the vibrating member is equal to or greater than the thickness of the piezoelectric element.

4. A vibrating device comprising:
a piezoelectric element;
a resin member having electric insulation and including a first principal surface joined to the piezoelectric element and a second principal surface opposing the first principal surface;
a vibrating member including a third principal surface joined to the second principal surface of the resin member and a fourth principal surface opposing the third principal surface and made of metal; and
a pair of electrodes disposed on the first principal surface of the resin member and electrically connected to the piezoelectric element, wherein
the pair of electrodes is separated from the piezoelectric, element, and
the resin member covers a whole of the third principal surface of the vibrating member.

5. A vibrating device comprising:
a piezoelectric element including a piezoelectric body including a first principal surface and a second principal surface opposing each other, and a first electrode and a second electrode disposed on the first principal surface;
a resin member having electric insulation and including a third principal surface joined to the piezoelectric element and a fourth principal surface opposing the third principal surface;
a vibrating member including a fifth principal surface joined to the fourth principal surface of the resin member and a sixth principal surface opposing the fifth principal surface and made of metal;

a third electrode and a fourth electrode disposed on the third principal surface of the resin member;

a first conductive resin layer connecting the first electrode and the third electrode to each other; and a second conductive resin layer connecting the second electrode and the fourth electrode to each other.

6. The vibrating device according to claim 5, wherein the third electrode and the fourth electrode are separated from the piezoelectric element when viewed from a direction orthogonal to the first principal surface.

7. The vibrating device according to claim 5, further comprising an adhesive layer joining the piezoelectric element and the third principal surface, wherein the piezoelectric element includes a fifth electrode disposed on the second principal surface and electrically connected to the first electrode, and the adhesive layer covers the fifth electrode.

8. A vibrating device comprising:

a piezoelectric element;

a resin member having electric insulation and including a first principal surface and a second principal surface opposing each other;

a vibrating member including a third principal surface and a fourth principal surface opposing each other and made of metal;

a first adhesive layer joining the piezoelectric element and the first principal surface of the resin member;

a second adhesive layer joining the second principal surface of the resin member and the third principal surface of the vibrating member; and a pair of electrodes disposed on the first principal surface of the resin member and electrically connected to the piezoelectric element, wherein the pair of electrodes is separated from the piezoelectric element.

* * * * *